United States Patent [19]

Yuhara et al.

[11] Patent Number: 4,939,487

[45] Date of Patent: Jul. 3, 1990

[54] SURFACE ACOUSTIC WAVE FILTER

[75] Inventors: Akitsuna Yuhara, Kawasaki; Hitoshi Watanabe, Yokohama; Jun Yamada, Yokohama; Tetsuya Hirashima, Katsuta, all of Japan

[73] Assignee: Hitachi, Ltd., Tokyo, Japan

[21] Appl. No.: 219,250

[22] Filed: Jul. 15, 1988

[30] Foreign Application Priority Data

Jul. 20, 1987 [JP] Japan .................................. 178892

[51] Int. Cl.$^5$ .............................................. H03H 9/25
[52] U.S. Cl. ................................. 333/193; 333/195; 310/313.13
[58] Field of Search ............... 333/193, 194, 195, 196, 333/154, 151, 150; 310/313 R, 313 B

[56] References Cited

U.S. PATENT DOCUMENTS

| | | | |
|---|---|---|---|
| 3,582,840 | 6/1971 | De Vries | 333/193 |
| 4,114,116 | 9/1978 | Reeder | 333/196 X |
| 4,321,567 | 3/1982 | Sandy | 333/196 |
| 4,353,043 | 10/1982 | Gunton | 333/195 X |
| 4,405,874 | 9/1983 | Suthers | 310/310 B |
| 4,494,031 | 1/1985 | Barnes et al. | 333/193 X |
| 4,604,595 | 8/1986 | Kadota | 333/196 |

OTHER PUBLICATIONS

Lewis–"Triple Transit Suppression in Surface-Acoustic-Wave Devices", Electonics Letters, Nov. 16, 1972, vol. 8, No. 23; pp. 553–554.

Slobodnik, Jr.–"Nonlinear Effects in Microwave Acoustic LiNbO$_3$ Surface Wave Delay Lines", The Journal of the Acoustical Society of America, vol. 48, No. 1, (part 2) 1970; pp. 204–209.

Lewis–"Surface-Acoustic-Wave Filters Employing Symmetric Phase-Weighted Transducers", Electronic Letters, Mar. 22, 1973, vol. 9, No. 6; pp. 138–140.

Primary Examiner—Eugene R. LaRoche
Assistant Examiner—Seung Ham
Attorney, Agent, or Firm—Antonelli, Terry, Stout & Kraus

[57] ABSTRACT

When SAW filter is used as a receiving filter of an antenna duplexer filter in a cellular radio equipment, since a transmitting signal of an out-band frequency has a large power for the SAW filter, the large power can leak into the SAW filter to generate inter-modulation disturbances in the SAW filter. Since the inter-modulation disturbances are generated when the transmission power density of the surface acoustic wave is made too large, input converters are divided, and the divided converters are disposed in the direction perpendicular to the propagation direction of the surface acoustic wave to lower the transmission power density. Since the divided converters are connected in series, reduction in the impedance together with increase of the aperture length can be compensated.

3 Claims, 4 Drawing Sheets

SURFACE ACOUSTIC WAVE FILTER

FIELD OF THE INVENTION

The present invention relates to a surface acoustic wave filter, and particularly to a surface acoustic wave filter (SAW) device which has a small amount of inter-modulation due to its non-linear characteristics accompanied by incidence of a large power and a small amount of bad influence due to spurious signals, and which is also suitable for use as a duplexor filter of an antenna used in mobile communication equipment.

BACKGROUND OF THE INVENTION

As a conventional surface acoustic filter device, particularly as a duplexor filter of an antenna for mobile communication equipment, a SAW filter of a three electrode structure is typically employed, which has a central electrode used as an output electrode and electrodes connected electrically in parallel and used as input electrodes on both sides of the output electrode. The reason why this three electrode structure is adopted is for reducing an amount of reflection at the electrodes due to both radiation and an amount of loss due to the two-way characteristic of the SAW transmitter-receiver electrodes by means of matching of the central electrode, and when the two electrodes on the both outer sides operating as an input electrode and the central electrode operating as an output electrode are made to match external circuits in the input and output sides respectively, the loss due to above-mentioned two-way characteristics can be reduced to 3 dB as described in, for example, Electronics Letters, Vol. 8 (23), p. 553 (1970). On the other hand, in order to reduce out-band responses of a filter, electrodes on the outer sides are weighted in amplitude and the like as seen in, for example, Technical Report of the Institute of Electronics and Communication Engineers, Japan, MW 82-4. In order to further reduce the above-mentioned two-way loss, the above-mentioned three electrode structure has been developed, and a SAW filter in which a plurality of transmitting electrodes and receiving electrodes are alternately disposed on the same propagation path and disposed in symmetry with each other is employed as described in, for example, U.S. Pat. No. 3,582,840.

In the case where the SAW filter having the above-mentioned conventional structure was used as a filter on the receiving side (the first stage) of a duplexer filter, there was a problem that since a high power transmitting signal (frequency $f_T$) was incident on the out-band of this filter, when a weak out-band spurious signal (frequency $f_{SP}$) entered via an antenna into this filter, the spurious signal and the transmitting signal were coupled to produce intermodulation signals due to the non-linear characteristics of the filter, one of which formed a signal in a receiving band ($f_R$), providing disturbances to speech.

The occurrence of the above-mentioned problem is suggested as results of experiments on inter-modulation characteristics using the SAW filter based on the above-mentioned first literature on the Pre-Print of the Institute of Electronics and Communication Engineers, Japan, 1982 Conference 8-161 (1983).

SUMMARY OF THE INVENTION

It is an object of the present invention to provide a SAW filter which has a small amount of inter-modulation due to its non-linear characteristics, makes difficult the generation of disturbances of speech due to spurious waves outside the receiving band, and is suitable for a branching filter in mobile communication equipments.

In order to accomplish the above-mentioned object, in a SAW filter according to the present invention, the input converter comprises at least a plurality of divided converters which are shifted in the direction perpendicular to the direction along which the SAW propagates, the divided converters being connected in series Since the divided converters are disposed perpendicularly to the direction along which the SAW propagates, the transmission power density of the SAW is reduced. As a result, an amount of inter-modulation is reduced and furthermore, reduction in the impedance due to increase of the aperture length is prevented.

DESCRIPTION OF THE PREFERRED EMBODIMENTS

Before an embodiment according to the present invention is described, the relationship between the transmission power density and the non-linear distortion of a SAW filter and technical matters related to them will be described.

Figure 4:
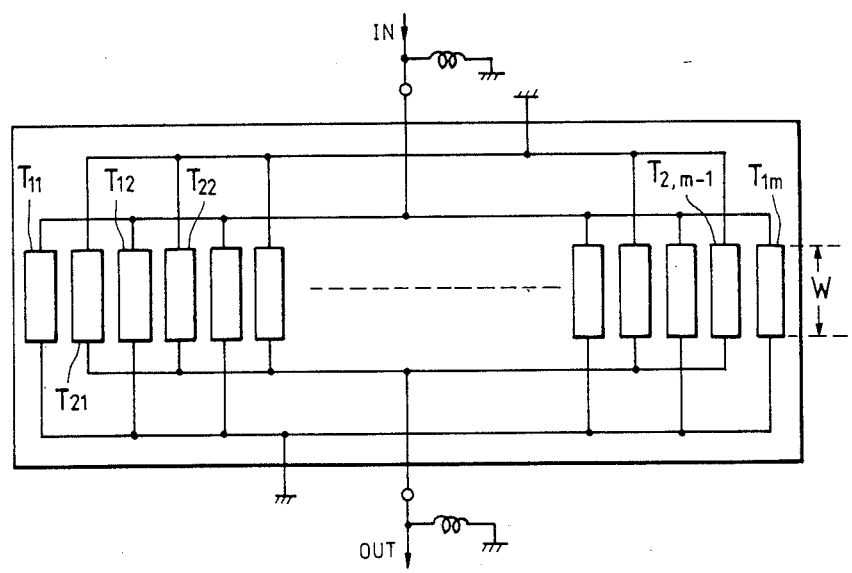
FIG. 4 is a layout drawing of a SAW filter having a multi-electrode structure in which an input converter is sandwiched by two adjacent output converters.

For instance, a conventional example of a filter structure as shown in FIG. 4 is considered, in which input converters and output converters are composed of m ($m \geq 2$) input converters $T_{11}$, $T_{12}$, --- $T_{1m}$ and $(m-1)$ output converters $T_{21}$, $T_{22}$, --- $T_{2m-1}$, respectively, and the input converter $T_{1i}$ and the output converter $T_{2j}$ are alternately disposed on the same propagation path with an equal aperture length W. Here, assuming that the SAW emitting power in each of the m input converters is represented by $Pa'_{(T1)}$ and the propagating power density toward one side is represented by $Pa_{(T1)}$, the stress $T_{(T1)}$ yielded at the transmitting electrode of the input inverter is given by the following expression;

$$T_{(T1)} = \alpha(Pa \times_{(T1)} \cdot \omega)^{\frac{1}{2}} \text{(Effective value of amplitude)} \quad (1)$$

$$Pa_{(T1)} = Pa'_{(T1)}/2W \quad (2)$$

Here, $\alpha$ is a proportional coefficient determined by a surface acoustic wave substrate The surface acoustic wave (SAW) having the strength corresponding to the stress $T_{(T1)}$ at the transmitting electrode propagates, and higher harmonic components of the second order, the third order, and the like are generated by the non-linear effect, which grow as they propagate as shown in The Journal of the Acoustical Society of America, Vol 48, pp 203 through 210 (1970). As a result, at the time point when the SAW reaches the output converter, the following non-linear components are generated in the stress $T_{(T2)}(t)$.

$$T_{(T2)}(t) = a_1' T_{(T1)}(t) + a_2' T_{(T1)}^2(t) + a_3' T_{(T1)}^3(t) \quad (3)$$

Here, when a signal of two angular frequencies is applied to the input converter $\omega_1$, $\omega_2$ to generate the stress shown in the following expression, $$T_{(T1)}(t) = T_{(T1)1}\cos\omega_1 t + T_{(T1)2}\cos\omega_2 t \quad (4)$$

inter-modulation outputs as shown in the following expressions are generated in the output converter besides a fundamental wave response, a second higher harmonic wave, and a third higher harmonic wave $$T^{(1)}_{IM}\cos(\omega_1 - \omega_2)t + T^{(1)}_{IM}\cos(\omega_1 + \omega_2)t + \quad (5)$$
$$T^{(2)}_{IM}\cos(2\omega_1 - \omega_2)t + T^{(2)}_{IM'}\cos(2\omega_2 - \omega_1)t +$$
$$T^{(3)}_{IM}\cos(2\omega_1 + \omega_2)t + T^{(3)}_{IM'}\cos(2\omega_2 + \omega_1)t$$

where $$\begin{aligned} T^{(1)}_{IM} &= a_2'\ T_{(t1)1} \cdot T_{(T1)2}' \\ T^{(2)}_{IM} &= T^{(3)}_{IM} = (\tfrac{3}{4})\, a_3'\ T^2_{(T1)1} \cdot T_{(T1)2} \\ T^{(2)'}_{IM} &= T^{(3)'}_{IM} = (\tfrac{3}{4})\, a_3'\ T_{(T1)1} \cdot T^2_{(T1)2} \end{aligned} \quad (6)$$

Here, assuming that $\omega_1 = \omega_{SP}$ (disturbing wave), $\omega_2 = \omega_T$ (transmitting wave), $T_{(T1)1} \ll T_{(T2)2}$, and it is $T_{IM}^{(2)'}\cos(\omega_2 - \omega_1)t$ given by the following expression (7) that has the maximum value and comes into question among inter-modulation outputs generated within the band.

$$\omega_1 = \omega_{SP} = 2\omega_T - \omega_R \quad (7)$$

In accordance with the same relation as the expression (1) corresponding to the $T_{IM}^{(2)'}$, inter-modulation power is incident on each of the (m−1) output inverters from the both sides. Since the output converter is matched with the external circuit within the band, waves coming from input converters remote from the next converter but one are absorbed into the adjacent output converter. The waves are not, therefore, incident on the output converter. But, a considerable amount of out-band waves is penetrated and made incident. Representing the correction term for the fundamental wave power by $\gamma_1$ for $\omega_1$ and by $\gamma_2$ for $\omega_2$, and the SAW emitting power of each the input converters by $Pa'_{(T1)1}(\omega_1)$ at $\omega_1$ and by $Pa'_{(T1)2}(\omega_2)$ at $\omega_2$, inter-modulation power $Pa'_{(T2)}{}^{(2)}_{IM}$ generated in each of the input and output inverters respectively are represented by the following expression.

$$Pa'_{T\,IM} = \left(\frac{\omega_1}{\omega_2}\right)\left(\frac{\omega_2}{\omega_R}\right)^2 (\gamma_1 \cdot \gamma_2^2)^2 \frac{x'}{(2W)^2} Pa'_{(T1)1} \quad (8)$$
$$(\omega_1)\{Pa'_{(T1)2}(\omega_2)\}^2$$
$$= \left(\frac{\omega_1}{\omega_R}\right)\left(\frac{\omega_2}{\omega_R}\right)^2 (\gamma_1 \cdot \gamma_2^2)^2\, x'\, Pa'_{(T1)1}$$
$$(\omega_1)\{Pa_{(T1)2}(\omega_2)\}^2$$

where $$x' = a_3'^2(\alpha^2\omega_R)^2 \quad (9)$$

As shown by the expression (8), it is found that the in-band inter-modulation output generated per each of the output converters is proportional to the square of the SAW propagating power density per each of the input converters at $\omega_2$.

The relationship between the traveling wave power (that is, it corresponds to the available power) $P_{00}$ incident on the input side of the filter from the outside of the matching circuit and the in-band inter-modulation power $P_{IM\text{-}out}(\omega_R)$ is obtained. Assuming that the input side traveling wave power be represented at the angular frequency $\omega_1$ by $P_{001}$ and $P_{002}$ at the angular frequencies $\omega_1$ and $\omega_2$ respectively, the power transfer function from the power source terminal at the input side to the radiation conductance of the equivalent circuit of the input converter by $F_1(\omega)$, and the power transfer function from the load terminal at the output side to the emission conductance of the equivalent circuit of the output electrode by $F_2(\omega_R)$, the in-band inter-modulation power $P_{IM\text{-}out}(\omega_R)$ fetched to the load at the output side is expressed by the following expression.

$$P_{IM\text{-}out}(\omega_R) = \left(\frac{\omega_1}{\omega_R}\right)\left(\frac{\omega_2}{\omega_R}\right)^2 x'\,\{(1 - \quad (10)$$
$$m^1\gamma^2 F_2(\omega_R)F_1(\omega_1)P_{001}\} \times \left(\frac{\gamma^2 \cdot F_1(\omega_2)}{2W \cdot m}\, P_{002}\right)^2$$

It is found from the expression (10) that the increase of the aperture length W of the input/output converter and the increase of the number m of the input/output converter reduce the current density in each of the input/output converters due to the traveling wave power made incident on the out-band of the filter on the receiving side from the transmitting side. Since the above-mentioned power density influences the inter-modulation output with a square as seen in the expression (10), the reduction in the power density has a large effect on reduction in disturbances due to the inter-modulation. But, if the aperture length W is increased or the number m of the input/output converters is increased as the conventional structure is, the admittance of the input/output converter is made too large, resulting in difficulty in matching to output circuits On the contrary, if the impedance is made constant, the inter-modulation output can not be reduced as shown in the expression 10 because the product of W and M is constant.

Figure 1:
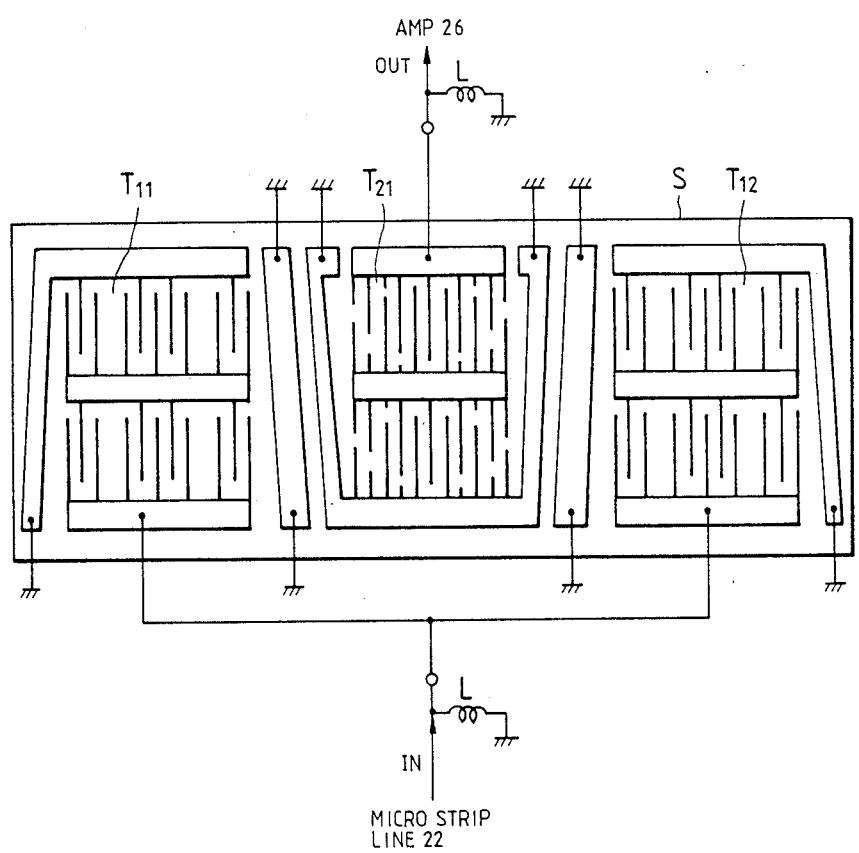
FIG. 1 through FIG. 3 are layout drawings of electrodes showing an embodiment according to the present invention respectively.
Figure 5:
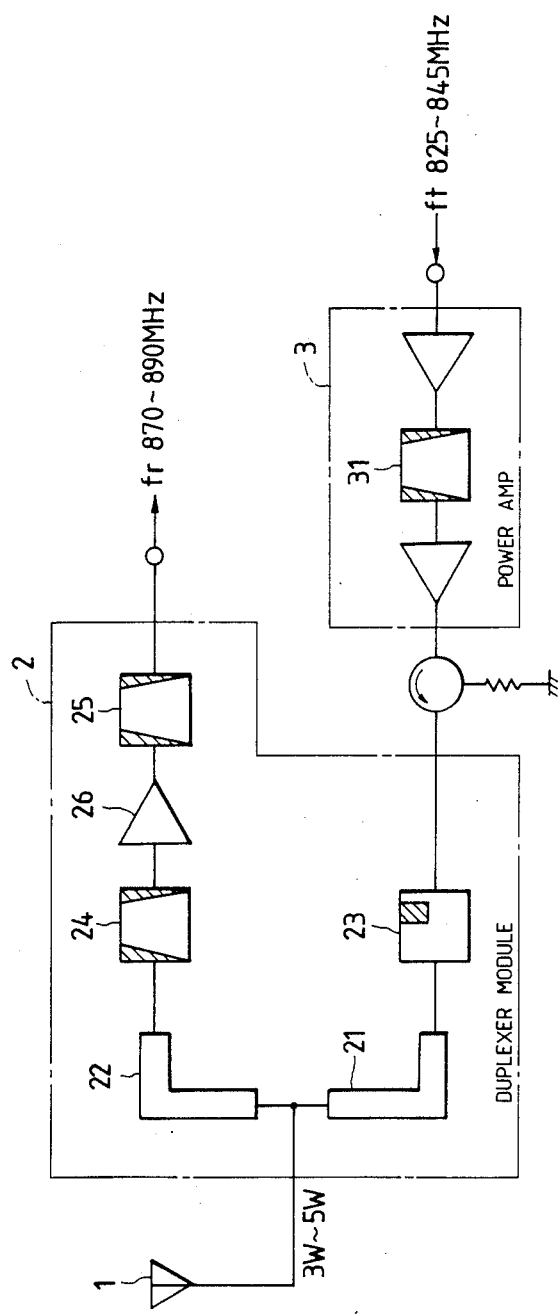
FIG. 5 is a block diagram of a branching filter of a cellular radio system.

FIG. 1 shows a first embodiment according to the present invention and this SAW filter is used as a first filter on the receiving side in the block diagram shown in FIG. 5.

In FIG. 5, reference numerals 1, 2 and 3 are an antenna, a duplexer filter module, and a power amplifier respectively. In the module 2, microstrip lines 21 and 22, a transmitting first filter 23, receiving first and second filters 24 and 25, and an amplifier 26 are provided Also, a transmitting second filter 31 is provided in the power amplifier 3. The transmitting frequencies 825 to 845 MHz are in the out-band of the receiving frequencies 870 to 890 Mhz. But, since the transmitting power is as large as 3 to 5 W, the receiving first filter 24 responses to this too large out-band signal. As a result, inter-modulation distrubances are generated.

A substrate of LiNbO$_3$ of the 128° rotated Y-cut with X-propagation is used as the substrate S in FIG. 1, electrodes weighted in phase are used as first stage input converters $T_{11}$ and $T_{12}$ on the both outer sides, and symmetrical electrodes weighted in amplitude are used as a central first stage output converter $T_{21}$ as shown in FIG. 1. Each of the converters $T_{11}$, $T_{12}$ and $T_{21}$ are disposed so as to divide thereof in the up and down direction and composed of upper converters and lower converters both connected in series. This embodiment is constituted so as to selectively pass only a component of the receiving frequency $f_R (=\omega_R/2\pi)=880\pm10$ MHz in. accordance with the standard of the cellular radio system in the U.S.A., and sputtering electrodes made of Al-0.8 wt % Ti are employed as a transmit/receive electrode. Incidentally, a mark L is a matching inductor. In the case where the aperture length in the electrode element does not depend on the present invention, it can be enlarged to from 300 μm to 600 μm, and the inter-modulation is estimated to be reduced by 12 dB.

Then, according to experiments using the present embodiment, the level of the in-band disturbing signal was able to be made below −116 dBm which corresponded to the required receiving sensitivity. In the case where the above-mentioned level did not depend on the present invention, the level was not able to be made lower than −116 dBm if the strength of the disturbing wave was not as small as −60 to 70 dBm. It was prescribed that any disturbing signal having the level larger than the abovementioned lowest receiving signal strength −116 dBm (receiving sensitivity) shall not be generated in the receiving band for a disturbing wave (its strength is lower than −56 dBm) having the level lower than 60 dB compared with the lowest level of the receiving signal. Accordingly, the prescription was not able to be satisfied.

The present invention allows a large aperture length to be adopted because the freedom of the aperture is magnified. Influences due to diffraction of a surface acoustic wave can be, therefore reduced. In the case where the construction of the first embodiment was applied, as it was, to a second intermediate frequency filter for a satellite broadcasting receiver having the center frequency of 402.78 MHz and the bandwidth of 30 MHz, an amount of out-band attenuation was able to be made to increase from 31 dB to 35 dB.

Figure 2:
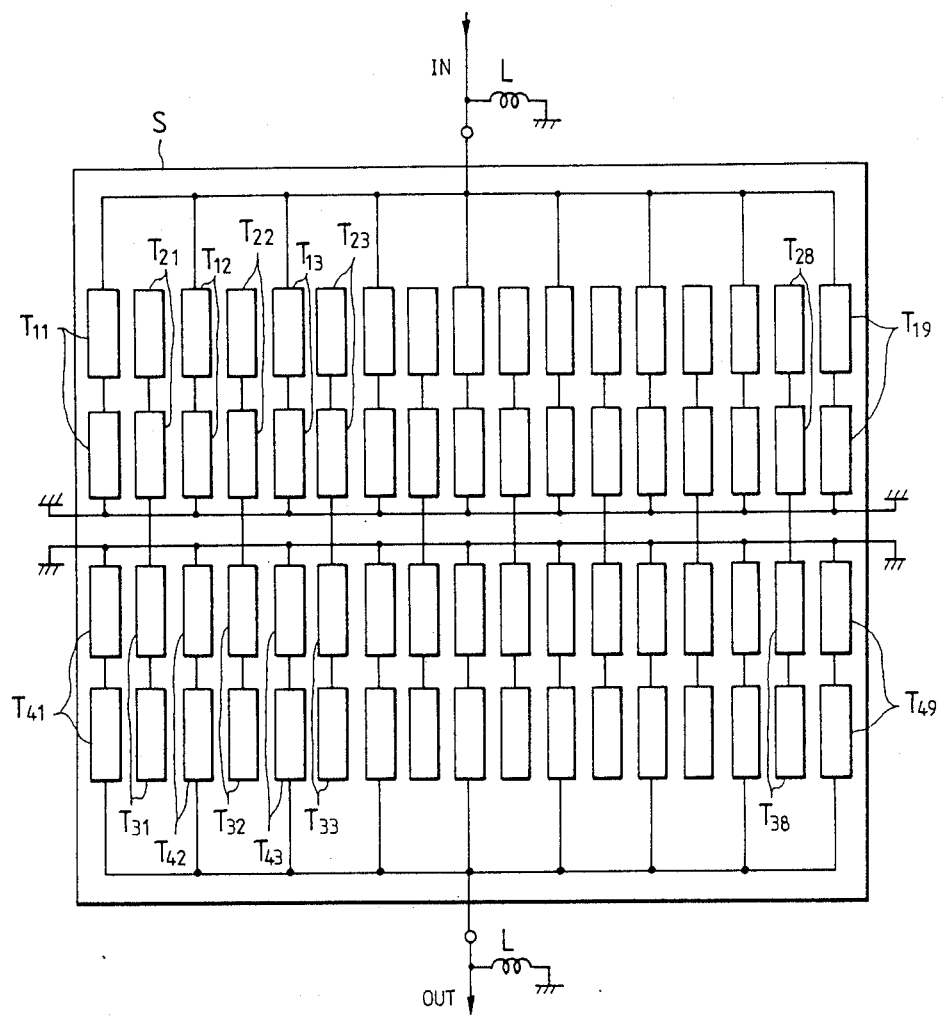

FIG. 2 is a diagram of a second embodiment according to the present invention. The present embodiment is a first filter on the receiving side of an antenna duplexer filter, and is constituted so as to make only a receiving frequency $f_R (=\omega_R/2\pi)=880\pm10$ MHz component pass selectively in accordance with the standard of the cellular radio system in the U.S.A. On the surface acoustic wave substrate S, 9 first stage input converters $T_{11}$ to $T_{19}$ (m=9) connected in parallel with each other and 8 first stage output converters $T_{21}$ to $T_{28}$ are provided alternately at equal intervals from the input inverters $T_{11}$ to $T_{19}$, and furthermore, 8 second stage transmitting wave electrodes $T_{31}$ to $T_{38}$ connected electrically in series to the 8 first stage receiving wave electrodes $T_{21}$ to $T_{28}$ are provided on the propagation path in which the surface acoustic wave is not transmitted and received between the second stage electrodes and the first stage electrodes with each other and 9 second stage receiving wave electrodes $T_{41}$ to $T_{49}$ connected electrically in parallel with each other are provided alternately at equal intervals from the second stage transmitting wave electrodes $T_{31}$ to $T_{38}$ Here, a substrate of $LiNbO_3$ of 36° rotated Y-cut with X-propagation is used as the surface acoustic wave substrate, and the above-mentioned electrodes are all bamboo blind-shaped transmit/receive electrodes in which a film having the thickness of 0.1 μm through sputtering of Al-0.8 wt % Ti is used. The first stage input converters $T_{11}$ to $T_{19}$ and the second stage output converters $T_{41}$ to $T_{49}$ are both constituted of normal-type electrodes, and the first stage output converters $T_{21}$ to $T_{28}$ and the second stage input converters $T_{31}$ to $T_{38}$ are both constituted of electrodes weighted in phase. Within the pass band, these electrodes have a radiation conductance of the same value and an imaginary part of admittance (susceptance) of substantially zero value, and they are image-matched with each other. Each converter is composed of two divided converters connected in series, and the propagation paths of the two divided converters are disposed so as not to overlap each other. The aperture length of each divided converter is 280 μm and the aperture length W of the whole of the input converters or output converters is 560 μm. Here, each radiation conductance of the whole of the first stage input converters (9 in parallel) and the whole of the second stage output converters (9 in parallel) is 20 mS within the pass band and matched to conductance 20 mS (that is, an impedance 50Ω system) of the external circuits on the input and output sides within the pass band by a parallel matching inductor $L\approx10$ nH. The filter loss in the pass band is suppressed below 4 dB by matching between the input/output converter and the external circuit and matching between the first stage output converters and the second stage input converters. The amount of attenuation outside the pass band is made to be 50 dB by the weighting of the first stage output converter and the second stage input coverter and the characteristics of the first stage input converter and the second stage output converter.

Here, according to the cellular radio system in U.S.A., the antenna output of the class II is 1.6 W. The power 2 W made incident on the transmit/receive branching circuit from the transmitting circuit is branched and the half power 1 W is made incident on the first filter on the receiving side. Since the transmitting frequency $f_T=\omega_T/2\pi=835\pm10$ MHz component is outside the band, it is substantially reflected to go toward the antenna But, since this power is too large for the SAW filter, sometimes out-band leakage waves of a not negligible degree exist. Moreover, in the case where an out-band spurious disturbing wave according to the expression (7) exists at the frequency $f_{SP}=\omega_{SP}/2\pi=790\pm10$ MHz, a disturbing signal appears due to inter-modulation between the above-mentioned leakage wave based on the transmitting wave and thereof. Here, the U.S.A. standard provides that the sensitivity for the receiving wave shall be such a value with which a signal as very weak as −116 dBm can be received. The U.S.A. standard provides that the sensitivity (spurious sensitivity) for out-band spurious disturbing waves shall be over, for example, 60 dB. In other words, it provides that any disturbing signal having the level over the above-mentioned level of −116 dBm shall not be produced within the receiving band for a disturbing wave (its receiving strength is below −56 dBm) having its level below 60 dB compared with the lowest level of the receiving signal. In the present embodiment, power density is reduced by enlarging the aperture length. In the present embodiment, since impedances and the like are made equal to those in the case where the aperture length is not enlarged, that is, it is 140 μm, the whole length of the apertures can be increased by four times equal to the square of the number of stages in series, that is, $2^2$. From the expression (10), an in-band inter-modulation output is, therefore, estimated to be reduced to $\frac{1}{4}^2 = 1/16$ compared with that in the case where the aperture length is 140 μm. In other words, the inter-modulation output is estimated to be reduced by 12 dB.

Incidentally, the expression (10) is derived for a filter having a constitution of one stage In a filter having a constitution of two stages, since the inter-modulation signal generated in the first stage is added with that generated in the second stage, the sum of them is larger than the value in the expression (10), the form of the expression is as same as the expression (10) and has the strength proportional to $\{\gamma_2{}^2 F_1(\omega_2) P_{002}/2W \cdot m\}^2$.

Then, when experiments were conducted on the present embodiment, the spurious sensitivity was 67 to 75 dB, namely, the in-band disturbing signal level was below −116 dBm equivalent to the sensitivity for the disturbing signal strength of −49 to 41 dBm in the frequency band 780 to 800 MHz. On the other hand, in the conventional embodiment prior to the present invention in which the aperture length is made to be 140 μm, the spurious sensitivity is 55 to 63 dB and reduction in yield for the spurious sensitivity was observed In this embodiment, it was confirmed that the spurious sensitivity rised by about 12 dB for that of the conventional embodiment Since the SAW filter was able to be designed without changing the impedance there was no problem in its frequency characteristics.

Figure 3:
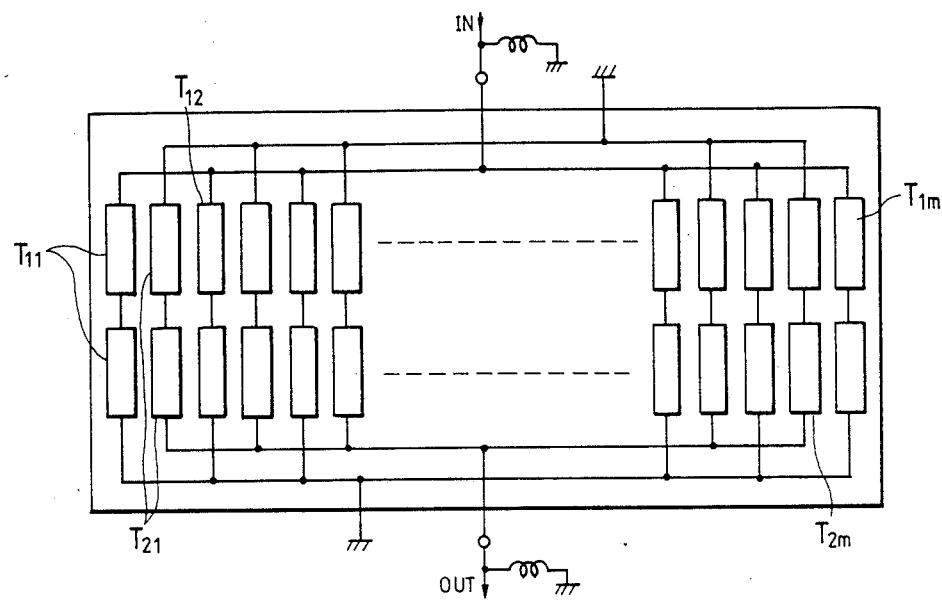

FIG. 3 is a third embodiment according to the present invention. The present embodiment differs from the second embodiment and has a constitution of one stage Electrodes weighted in phase are used for the first stage input converters $T_{11}$ to $T_{1m}$, thereby increasing an amount of the out-band attenuation. Also, since, in this embodiment, a inter-modulation strength complies with the expression (10) as it is, and further the first stage input converters are weighted in phase, the inter-modulation strength can be reduced by about 3 dB compared with that in the second embodiment.

Though, in the above-mentioned embodiments, any SAW filter is assumed to be used as the first stage filter on the receiving side of the antenna duplexer filter in the cellular radio system of U.S.A., the present filter is applicable to the first filter, the second filter on the receiving side, and the second filter on the transmitting side in the United Kingdom, Northern Europe ($f_R = 935$ to 960 MHz), and our country (870 to 885 MHz) except U.S.A. The present invention allows the aperture length W and the number of the electrodes m to be increased, that is, the power density to be largely reduced, thereby allowing the present invention to be applied to the first filter on the transmitting side used for power transmission to an antenna.

We claim:

1. A surface acoustic wave filter comprising: a piezoelectric substrate including first and second propagation paths thereon for propagation of surface acoustic waves;

first, second and third transducers each including electrodes provided on said first propagation path, said first transducer being disposed between said second and third transducers in the direction of said first propagation path;

fourth, fifth and sixth transducers each including electrodes provided on said second propagation path, said fourth transducer being disposed between said fifth and sixth transducers in the direction of said second propagation path;

first series connection means for connecting said first and fourth transducers in series to form a first series-connected-transducer;

second series connection means for connecting said second and fifth transducers in series to form a second series-connected-transducer;

third series connection means for connecting said third and sixth transducers in series to form a third series-connected-transducer;

parallel connection means for connecting said second and third series-connected-transducers to form a parallel-series-connected-transducer;

an input terminal connected to said parallel-series-connected-transducer for supplying said parallel-series-connected-transducer with an electrical signal from a signal source connected thereto; and an output terminal connected to said first series-connected transducer for outputting an electrical signal transduced by said first series-connected-transducer to a load circuit connected thereto.

2. A surface acoustic wave filter comprising a piezoelectric substrate and 4×m converters arranged in a matrix having 4 rows and m columns on the piezo-electric substrate, wherein each of the converters includes electrodes, wherein predetermined ones of the converters are acoustoelectric and predetermined others of the converters are electroacoustic, wherein, in the converters in the first row and the second row, the i-th column (i=2p+1, p=0, 1, —) is connected in series, the respective series-connected converters being connected in parallel with each other, wherein in the converters in the third row and the fourth row, the i-th column (i=2p+1, p=0, 1, —) is connected in series, the respective series-connected converters being connected in parallel with each other, and wherein in the converters in each row, the i-th column (i=2p, p=0, 1, —) is connected in series.

3. A surface acoustic wave filter according to claim 2, wherein converters in the second row and the third row are formed with electrodes weighted in phase.

* * * * *